United States Patent
Koch et al.

(10) Patent No.: US 10,481,505 B2
(45) Date of Patent: Nov. 19, 2019

(54) METHOD FOR DETERMINING AN IMAGING ABERRATION CONTRIBUTION OF AN IMAGING OPTICAL UNIT FOR MEASURING LITHOGRAPHY MASKS

(71) Applicant: Carl Zeiss SMT GmbH, Oberkochen (DE)

(72) Inventors: Markus Koch, Neu-Ulm (DE); Dirk Hellweg, Langenau (DE); Renzo Capelli, Heidenheim (DE); Martin Dietzel, Giengen a. d. Brenz (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/280,494

(22) Filed: Feb. 20, 2019

(65) Prior Publication Data
US 2019/0258170 A1 Aug. 22, 2019

(30) Foreign Application Priority Data
Feb. 21, 2018 (DE) .................. 10 2018 202 635

(51) Int. Cl.
*G03F 7/20* (2006.01)
*G03F 1/84* (2012.01)

(52) U.S. Cl.
CPC .......... *G03F 7/706* (2013.01); *G03F 1/84* (2013.01); *G03F 7/70083* (2013.01); *G03F 7/70641* (2013.01)

(58) Field of Classification Search
CPC ........ G03F 1/84; G03F 7/706; G03F 7/70083; G03F 7/70641
See application file for complete search history.

(56) References Cited

U.S. PATENT DOCUMENTS

| 10,068,325 | B2 | 9/2018 | Matejka et al. |
| 2013/0063716 | A1 | 3/2013 | Mann et al. |
| 2013/0083321 | A1 | 4/2013 | Wack et al. |

FOREIGN PATENT DOCUMENTS

| DE | 102 20 815 | 11/2003 | .............. G21K 7/00 |
| DE | 102 20 816 | 11/2003 | .............. G21K 7/00 |
| WO | WO 2016/012426 | 1/2016 | .............. G02B 17/08 |

OTHER PUBLICATIONS

Claus et al., "Aberration estimation using EUV mask roughness", *Proceedings of SPIE*, vol. 9422, pp. 942214-1-942214-6 (Mar. 19, 2015).

(Continued)

*Primary Examiner* — Michelle M Iacoletti
(74) *Attorney, Agent, or Firm* — Fish & Richardson P.C.

(57) ABSTRACT

Determining an imaging aberration contribution of an imaging optical unit for measuring lithography masks involves firstly focus-dependently measuring a 3D aerial image of the imaging optical unit as a sequence of 2D intensity distributions in different measurement planes in the region of and parallel to an image plane of an imaging of an object by use of the imaging optical unit. A spectrum of a speckle pattern of the 3D aerial image is then determined by Fourier transformation of the measured 2D intensity distributions having speckle patterns. For a plurality of spectral components in the frequency domain, a focus dependence of a real part $RS(z)$ and an imaginary part $IS(z)$ of said spectral component is then determined. From the determined values of the focus dependence of the real part $RS(z)$ and the imaginary part $IS(z)$, a contribution made to the speckle pattern spectrum by a mask structure, which contribution is to be eliminated, is then separated from an imaging aberration contribution made to the speckle pattern spectrum by the imaging optical unit. The imaging aberration contribution is then represented. This results in a method for deter- (Continued)

mining the imaging aberration contribution of the imaging optical unit having little additional time expenditure in comparison with the measurement time on the respective lithography mask.

20 Claims, 5 Drawing Sheets

(56) References Cited

OTHER PUBLICATIONS

Claus et al., "Quantitative phase retrieval with arbitrary pupil and illumination", *Optics Express*, vol. 23, No. 20 (Oct. 5, 2015).
Hellweg et al., "Actinic Review of EUV Masks: Performance Data and Status of the AIMS™ EUV System," Jun. 3, 2017, ZEISS, "https://www.zeiss.com/content/dam/smt/downloads/products_and_solutions/photomask-systems/Publications/spie_2017_paper.pdf".
Shankar et al., "Off-axis aberration estimation in an EUV microscope using natural speckle", *Imaging systems and applications: part of imaging and applied optics 2016*, Jul. 25-28, 206, Heidelberg, Germany. Washington, D.C., USA: OSA, The Optical Society, 2016.

METHOD FOR DETERMINING AN IMAGING ABERRATION CONTRIBUTION OF AN IMAGING OPTICAL UNIT FOR MEASURING LITHOGRAPHY MASKS

CROSS REFERENCE TO RELATED APPLICATION

This application claims priority under 35 U.S.C. § 119 to German Application DE 10 2018 202 635.1, filed on Feb. 21, 2018, the entire content of which is incorporated herein by reference.

TECHNICAL FIELD

The invention relates to a method for determining an imaging aberration contribution of an imaging optical unit for measuring lithography masks. Furthermore, the invention relates to a method for correcting an imaging aberration of an imaging optical unit of a metrology system for measuring lithography masks including a determining method of this type, and to a metrology system with which methods of this type can be carried out.

BACKGROUND

WO 2016/012426 A1 discloses a method for three-dimensionally measuring a 3D aerial image of a lithography mask.

Methods for determining imaging aberration contributions in optical units with the aid of a speckle measurement are known from the technical articles "Off-axis Aberration Estimation in an EUV Microscope Using Natural Speckle" by Shanker et al., Imaging and Applied Optics Congress, USA 2016, the technical article "Quantitative phase retrieval with arbitrary pupil and illumination" by R. A. Claus et al., Optics Express Vol. 23, No. 20, published on Oct. 2, 2015 and the technical article "Aberration estimation using EUV mask roughness" by R. A. Claus, Extreme Ultraviolet (EUV) Lithography VI, ed. O. R. Wood I I et al. proc. of SPIE Vol. 9422, 942214.

SUMMARY

A general aspect of the present invention is to determine the imaging aberration contribution of an imaging optical unit for measuring lithography masks with as little additional time expenditure as possible in comparison with the measurement time on the respective lithography mask.

This aspect is achieved according to the invention by use of a method for determining an imaging aberration contribution of an imaging optical unit (e.g., 8) for measuring lithography masks, comprising the following steps: a) focus-dependently measuring a 3D aerial image (e.g., 23) of the imaging optical unit (e.g., 8) as a sequence of 2D intensity distributions (e.g., $15_{Z1}$, $15_{Z7}$) in different measurement planes (e.g., $z_1$ to $z_7$) in the region of and parallel to an image plane (e.g., 14) of an imaging of an object (e.g., 5) by use of the imaging optical unit (e.g., 8); b) determining a spectrum $S(\vec{v})$ of a speckle pattern (e.g., 24) of the 3D aerial image (e.g., 23) by Fourier transformation of the measured 2D intensity distributions (e.g., $15_{Z1}$) having speckle patterns; c) determining, for a plurality of spectral components $S(v_{xi}, v_{yi})$ in the frequency domain, a focus dependence of a real part $RS(z)$ and an imaginary part $IS(z)$ of said spectral component; d) separating from the determined values of the focus dependence aa) a contribution (H) made to the speckle pattern spectrum ($S(\vec{v})$) by a mask structure, which contribution is to be eliminated, from bb) an imaging aberration contribution (Θ) made to the speckle pattern spectrum by the imaging optical unit (e.g., 8); and e) representing the imaging aberration contribution (Θ).

Implementations of the aspect can include one or more of the following features. It has been recognized according to the invention that it is possible, by use of a speckle pattern measurement, in the context of a 3D aerial image measurement which is regularly carried out anyway during a lithography mask measurement, to separate an imaging aberration contribution from a mask structure contribution to the speckle pattern. The imaging aberration contribution can then be represented, with the result that from this a qualification of the imaging optical unit can be carried out and, in particular, conclusions can be drawn regarding the extent to which said imaging aberration contribution can be reduced for example by use of a readjustment of the imaging optical unit of the metrology system. A separation can be carried out by means of determining a z-position of an intersection point of a profile of the focus dependence of the real part and the imaginary part of the respective spectral component. The method can be used to determine in particular aberrations which can be described by use of even functions.

The imaging optical unit can be part of a metrology system, in particular for the qualification of lithography masks and of still unstructured mask substrates, so-called mask blanks. A qualification of mask blanks, that is to say an assessment of the quality of still unstructured masks, can also be carried out with the aid of the determining method.

The defocus aberration can be calculated from a known illumination angle distribution (illumination setting) during the illumination of the measured lithography mask and also a known transmission function of the imaging optical unit. The transmission function can be a pupil transmission function. The pupil transmission function can be a binary function and have the value 1 for spatial frequencies within a numerical aperture of the imaging optical unit and 0 for spatial frequencies outside said numerical aperture.

For preparation of the representation of the imaging aberration contribution (Θ), the latter can be approximated with the aid of a linear combination of a set of orthogonal functions (Zi). This has proved to be worthwhile in practice since different measured imaging aberrations can be represented systematically by this means. In this case, it is possible to use a set of expansion functions which is calculated from an orthogonal polynomial set, for example from Zernike polynomials, but which itself does not constitute an orthogonal function set.

Coefficients ($z_N$) of a function expansion that arises in the course of the approximation are represented.

Zernike functions used as a set of functions during the preparation of the representation are advantageously adapted to symmetry conditions of imaging optical units.

A method carried out on an unstructured section of a lithography mask makes it possible to separate off a mask contribution in a simple manner during the method for determining an imaging aberration contribution. A mask blank measurement of this type regularly takes place anyway in the context of a measuring method for lithography masks, and so no or only a short measurement delay occurs as a result of this.

A method for correcting an imaging aberration (Θ) of an imaging optical unit (e.g., 8) of metrology system (e.g., 2) for measuring lithography masks includes the following steps: a) determining an imaging aberration contribution (Θ) of the imaging optical unit (e.g., 8) by a method according to any technique described above; and b) correcting the imaging aberration contribution (Θ) by readjusting optical components (e.g., 12) of the imaging optical unit (e.g., 8) taking as a basis the imaging aberration contribution (Θ) determined. The method uses the imaging aberration contribution determination for correcting the imaging aberration. The readjusting can be carried out during the operation of the metrology system. The readjusting can be carried out under open-loop or closed-loop control.

A metrology system (e.g., 2) for carrying out a method correcting an imaging aberration (Θ) of an imaging optical unit (e.g., 8) of metrology system (e.g., 2) for measuring lithography masks according to any technique described above includes an illumination optical unit (e.g., 7) for illuminating the lithography mask to be examined and including an imaging optical unit (e.g., 8) for imaging the object towards a spatially resolving detection device (e.g., 9). The advantages of such a metrology system correspond to those that have already been explained above with reference to the methods according to the invention.

The metrology system includes at least one displacement actuator (e.g., 13) for displacing an imaging component (e.g., 12) of the imaging optical unit (e.g., 8). Such a displacement actuator enables a reproducible readjustment.

The displacement actuator (e.g., 13) is signal-connected to a central open-loop/closed-loop control device (e.g., 11) of the metrology system (e.g., 2). Such a signal connection makes it possible to carry out the readjustment in the context of an automated process in association with the determination of the imaging aberration contribution. This automated process can proceed under open-loop or closed-loop control.

BRIEF DESCRIPTION OF DRAWINGS

One exemplary embodiment of the invention is explained in greater detail below with reference to the drawing. In said drawing.

DETAILED DESCRIPTION

Figure 1:
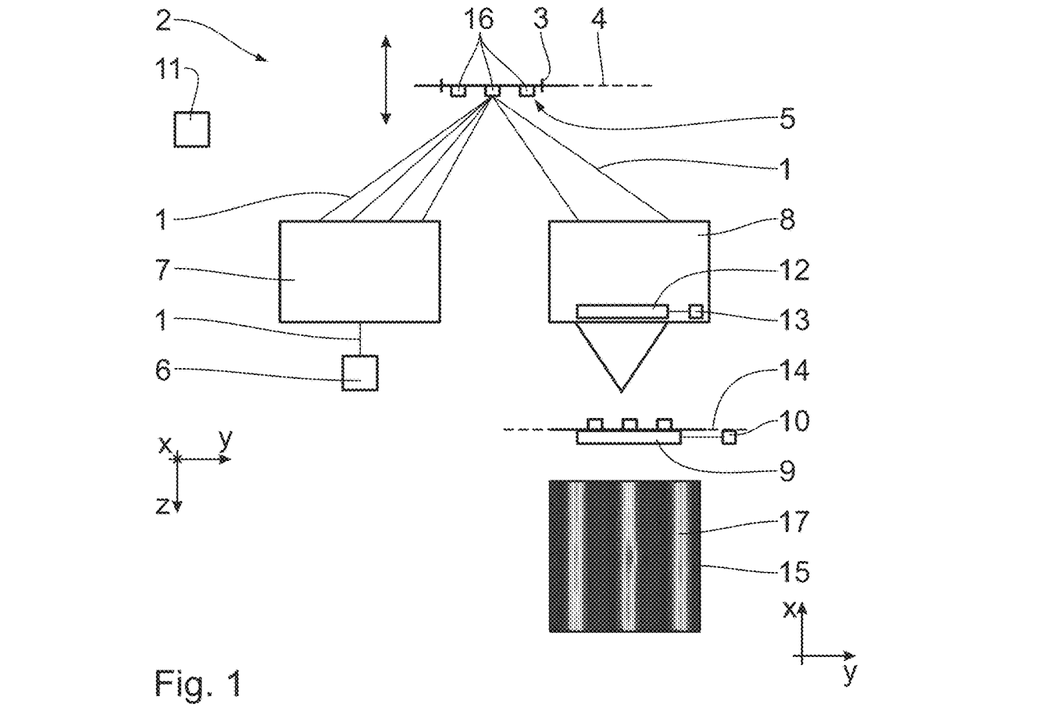
FIG. 1 shows highly schematically, in a plan view looking in a direction perpendicular to a plane of incidence, a metrology system for the examination of an object in the form of a lithography mask with EUV illumination and imaging light with an illumination optical unit and an imaging optical unit, each of which is illustrated extremely schematically.

In order to facilitate the presentation of positional relationships, a Cartesian xyz-coordinate system is used hereinafter. In FIG. 1, the x-axis runs perpendicularly to the plane of the drawing into the latter. The y-axis runs towards the right in FIG. 1. The z-axis runs downwards in FIG. 1.

FIG. 1 shows in a view corresponding to a meridional section a beam path of EUV illumination light and imaging light 1 in a metrology system 2 for the examination of an object 5, arranged in an object field 3 in an object plane 4, in the form of a reticle or a lithography mask with the EUV illumination light 1. The metrology system 2 is used for analyzing a three-dimensional (3D) aerial image (Aerial Image Metrology System) and serves for simulating and analyzing the effects of properties of lithography masks, known as reticles, which in turn are used during projection exposure for producing semiconductor components, on the optical imaging by projection optical units within a projection exposure apparatus. Such systems are known from WO 2016/012426 A1 (cf. FIG. 1 therein), from US 2013/0063716 A1 (cf. FIG. 3 therein), from DE 102 20 815 A1 (cf. FIG. 9 therein) and from DE 102 20 816 A1 (cf. FIG. 2 therein) and from US 2013/0083321 A1.

The illumination light 1 is reflected at the object 5. A plane of incidence of the illumination light 1 lies parallel to the yz-plane.

The EUV illumination light 1 is produced by an EUV light source 6. The light source 6 may be a laser plasma source (LPP; laser produced plasma) or a discharge source (DPP; discharge produced plasma). In principle, a synchrotron-based light source may also be used, for example a free electron laser (FEL). A used wavelength of the EUV light source may lie in the range between 5 nm and 30 nm. In principle, in the case of a variant of the metrology system 2, a light source for another used light wavelength may also be used instead of the light source 6, for example a light source for a used wavelength of 193 nm.

Depending on the embodiment of the metrology system 2, it may be used for a reflective or for a transmissive object 5. One example of a transmissive object is a phase mask.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle distribution with which the field points of the object field 3 are illuminated.

A numerical aperture of the illumination and imaging light 1 of the metrology system 2 is 0.0825 on the reticle side. The object field 3 in the object plane 4 has an extent of 8 µm in the x-direction and of 8 µm in the y-direction, that is to say is square.

After reflection at the object 5, the illumination and imaging light 1 enters an imaging optical unit or projection optical unit 8 of the metrology system 2, which is likewise indicated schematically in FIG. 1. The imaging optical unit 8 serves for imaging the object 5 towards a spatially resolving detection device 9 of the metrology system 2. The detection device 9 is designed e.g. as a CCD detector or CMOS detector.

The detection device 9 is signal-connected to a digital image processing device 10.

The object 5 is carried by an object holder (not illustrated). Said object holder can be displaced by use of a displacement drive on the one hand parallel to the xy-plane and on the other hand perpendicular to this plane, that is to say in the z-direction. The displacement drive, and likewise the entire operation of the metrology system 2, is controlled by a central control device 11, which, in a manner not illustrated in more specific detail, is signal-connected to the components to be controlled.

By way of example, FIG. 1 illustrates an imaging component 12 of the imaging optical unit 8, which can be a mirror or, with the use of illumination light wavelengths longer than EUV wavelengths, a lens element. The imaging component 12 is operatively connected to a displacement actuator 13, which is in turn signal-connected to the control device 11. By use of the displacement actuator 13, the imaging component 12 can be displaced independently of one another in the x-direction and/or in the y-direction and/or in the z-direction for the precise alignment of the imaging component 12. A spatial resolution of this displacement can be better than 10 μm and can in particular be better than 2 μm.

A magnification factor of the imaging optical unit 8 is greater than 500, and is 850 in the exemplary embodiment according to FIG. 1. A resulting image-side numerical aperture in the region of an image plane 14, in which a 3D aerial image of the object 5 arises, is in the region of $1 \cdot 10^{-4}$.

Below the detection device 9, a plan view of a 2D intensity distribution 15 in a measurement plane (e.g. z=0) is represented by way of example in FIG. 1. Structures 16 on the reticle 5 are represented as intensity maxima 17 running in the x-direction.

Figure 2:
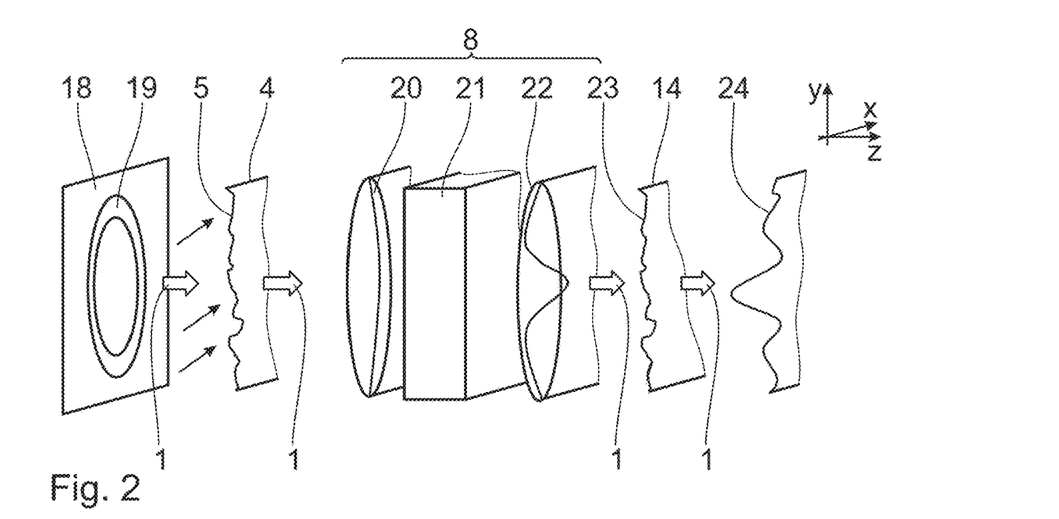
FIG. 2 schematically shows a propagation of the illumination and imaging light between an illumination pupil and an aerial image in the region of an image plane of the imaging optical unit, wherein a conversion of the aerial image into a spectrum of a speckle pattern is additionally illustrated as well.

FIG. 2 schematically shows a propagation of the illumination and imaging light 1 from a pupil plane 18 of the illumination optical unit 7 right into the region of the image plane 14. The variables or components respectively considered are indicated perspectively in the xyz-coordinate system. A pupil intensity distribution 19 of the illumination light 1 is present in the pupil plane 18, said distribution also being referred to as an illumination setting. A ring-shaped or annular pupil intensity distribution 19 is illustrated by way of example. The pupil intensity distribution 19 is represented mathematically as σ(K).

In this case, σ is the illumination intensity and K describes the location at which said illumination intensity is present, in pupil coordinates.

The illumination light 1 propagates from the pupil plane 18 into the object plane 4, where the illumination light 1 is incident on the object 5, which has a roughness illustrated in an exaggerated fashion in FIG. 2. This results in a wavefront $$\frac{4\pi}{\lambda}h(\vec{r}) + \vec{r}\vec{\kappa}$$

and a field distribution of the illumination light 1, which can be written as $$\varphi(\vec{r}, \vec{\kappa}) \sim \left(1 + \frac{4\pi}{\lambda}h(\vec{r})\right)e^{i\vec{r}\vec{\kappa}}$$

The designations here have the following meanings:
$\vec{r}$: Spatial coordinate vector having coordinates xy;
λ: Wavelength of the illumination light;
h: Roughness of the object (sagittal height in the z-direction).

After being reflected at or passing through the object 5, the illumination light 1 propagates through an entrance pupil 20 of the imaging optical unit 8, the imaging components of which are indicated at 21 in FIG. 2, and afterwards through an exit pupil 22. Afterwards, the object 5 is imaged into an aerial image 23 in the region of the image plane 14. A Fourier transformation of the respective 2D intensity distribution in the x- and y-directions, that is to say of a "slice" of the aerial image 23, yields a speckle spectrum 24, that is to say a spectrum $S(\vec{v})$ of a speckle pattern of the aerial image 23.

The following holds true for said speckle spectrum:

$$S(\vec{v}) \approx -\frac{8\pi}{\lambda}H(\vec{v})\Theta(\vec{v})$$

Here it holds true that:
v: The frequency-proportional wavenumber 1/λ having frequency coordinates $v_x$, $v_y$;
H: Roughness spectrum, that is to say the Fourier transformation of the object roughness h;
$\Theta(\vec{v})$: Aberration function of the optical unit, which is in turn defined as:

$$\Theta(\vec{v})=(\sigma P\otimes\varphi_e P)(\vec{v})-(\sigma\varphi_e P\otimes P)(\vec{v})$$

Here it holds true that:
σ: Intensity distribution of the illumination setting in a pupil plane;
P: Pupil transmission function of the optical unit, that is to say for example the effect of pupil limiting by an aperture and/or obscuration stop;
$\varphi_e$: The even wavefront aberration of the optical unit, that is to say an aberration contribution that can be described by an even function.

Figure 3:
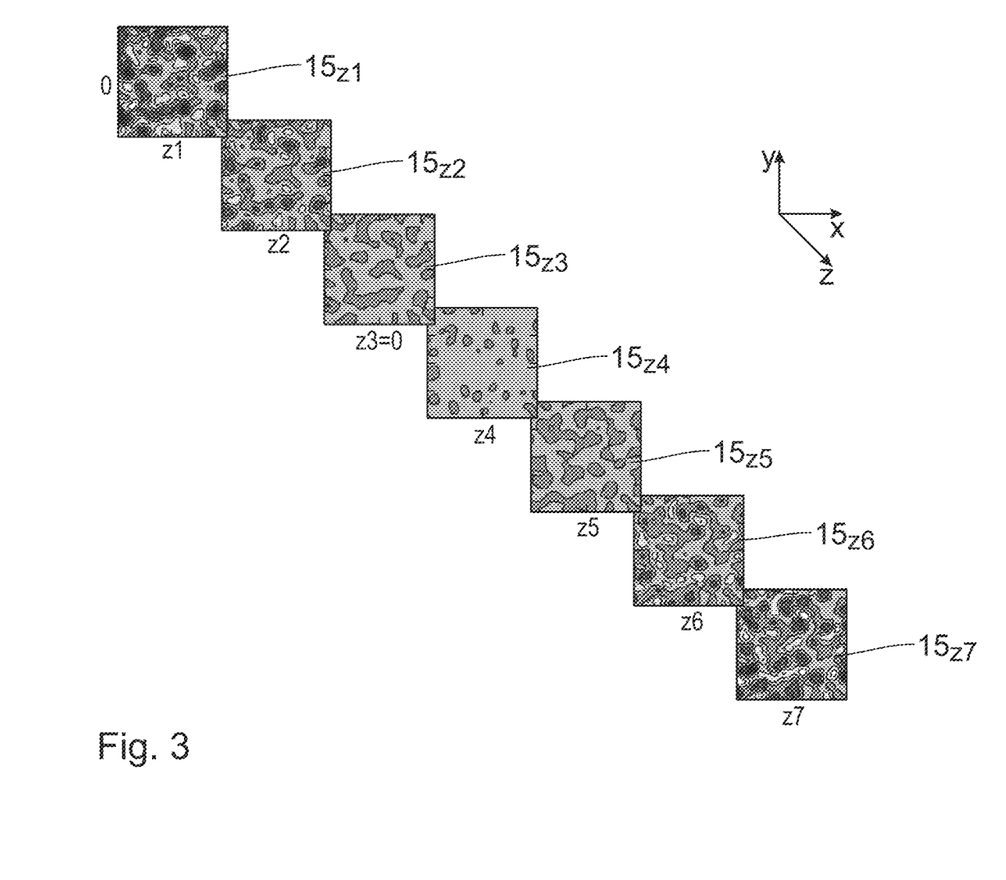
FIG. 3 shows a sequence of 2D intensity distributions in different focus measurement planes in the region of the image plane, wherein this sequence represents a 3D aerial image which can be measured by the metrology system.
Figure 4:
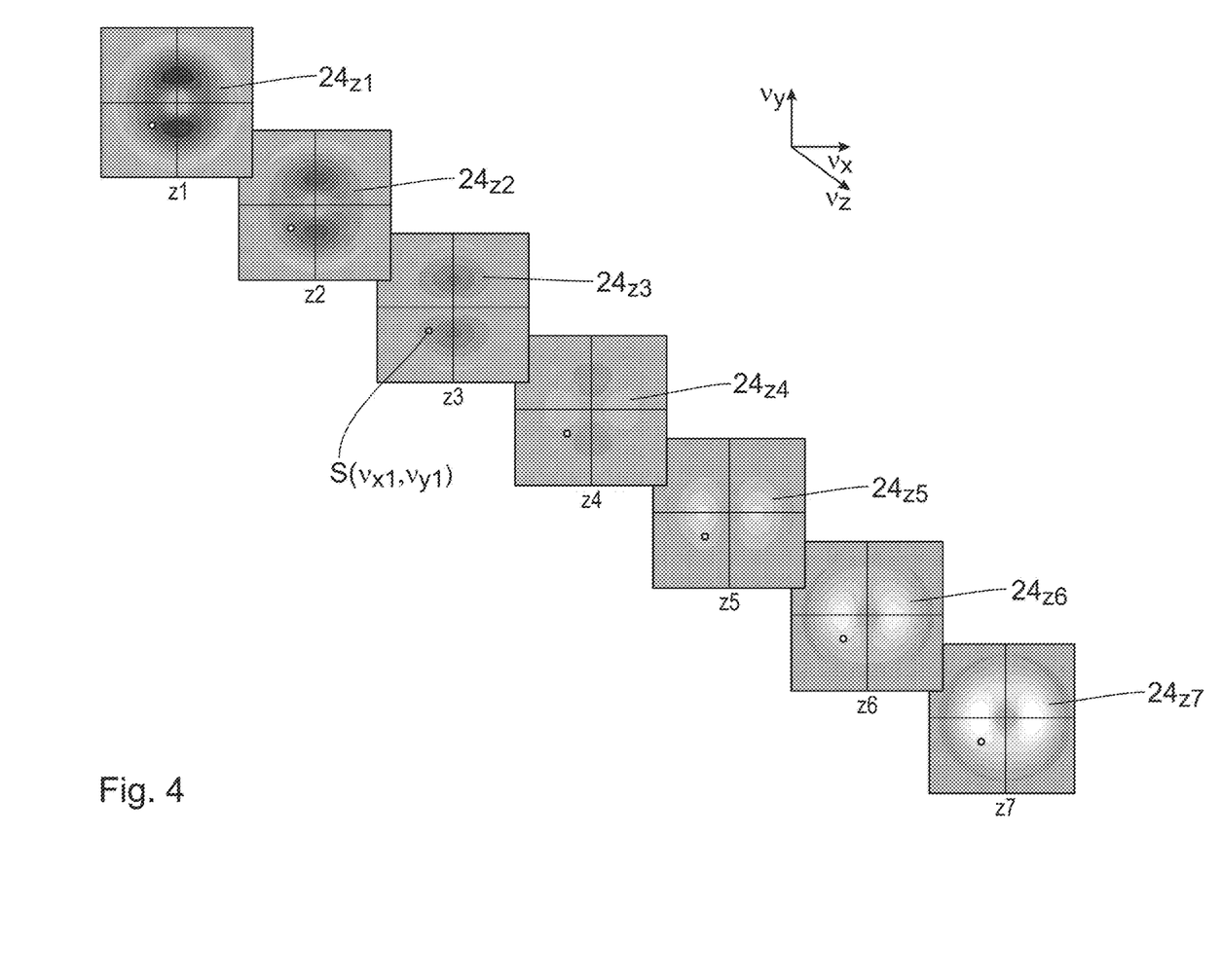
FIG. 4 shows, in a manner assigned to the sequence according to FIG. 3, a sequence of spectra of a speckle pattern of the 3D aerial image, determined by Fourier transformation of the 2D intensity distributions according to FIG. 3.
Figure 6:
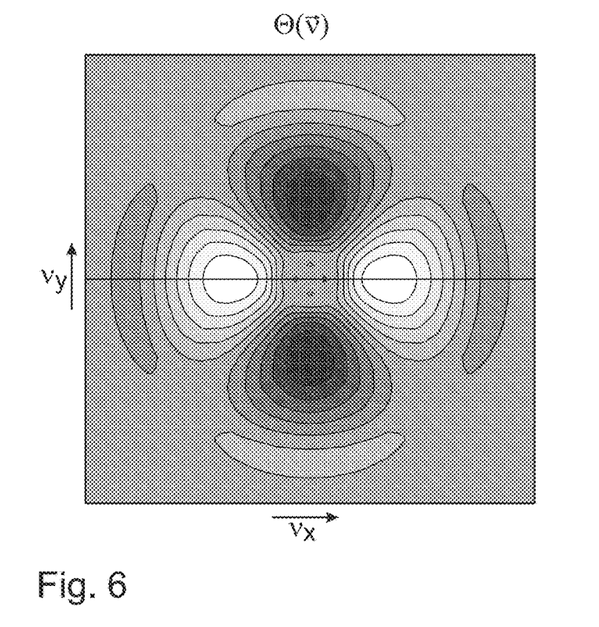
FIG. 6 shows by way of example an ascertained imaging aberration of the imaging optical unit of the metrology system, represented as a frequency-dependent aberration function, which imaging aberration arises as the result of a separation from specific values of the focus dependence of the spectral components in the manner of the spectral components according to FIG. 5.

A method for determining an imaging aberration contribution of the imaging optical unit 8 is explained below with reference to FIG. 3 et seq. The grey-scale values indicated in FIGS. 3, 4 and 6 are in each case a measure of the light intensity present at the location respectively considered.

What is carried out firstly is a focus-dependent measurement of the 3D aerial image 23 of the imaging optical unit 8 as a sequence of 2D intensity distributions $15_{z1}$ to $15_{z7}$ in different measurement planes z1 to z7 in the region of parallel to the image plane 14 (z3=0) of the imaging of the object 5. In this case, in contrast to the illustration according to FIG. 1, what is imaged is not a structured object, but rather a (still) unstructured mask, that is to say a mask blank or a non-structured region of a mask. The aerial image that is recorded over the sequence of the 2D intensity distributions $15_{z1}$ shows a spatial distribution of speckles, which can be understood as the result firstly of a mask (remainder) structure contribution and of an imaging aberration contribution of the imaging optical unit 8.

This is then followed by determining the spectrum $S(\vec{v})$ of said speckle pattern of the 3D aerial image detected in the preceding step by Fourier transformation of the 2D intensity distributions $15_{zi}$. This results in a sequence of 2D speckle spectra $24_{z1}$ to $24_{z7}$, as a function of the frequency coordinates $v_x$ and $v_y$.

Figure 5:
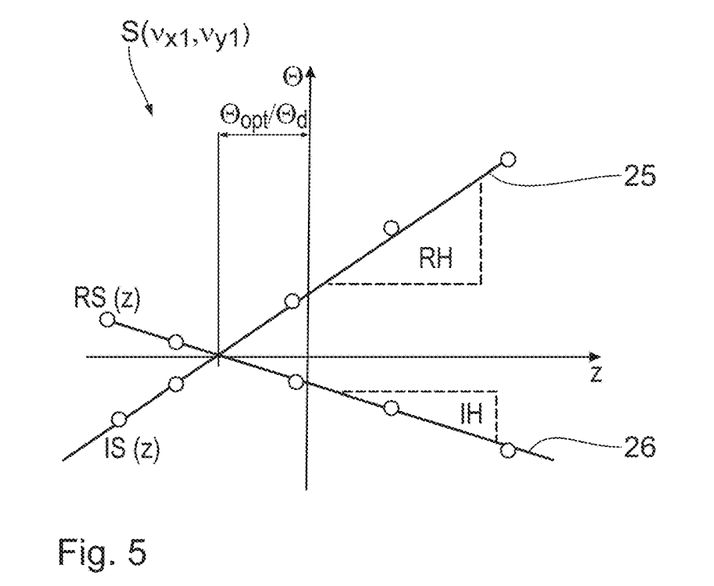
FIG. 5 shows schematic profiles of a real part and an imaginary part of a selected spectral component of the speckle pattern spectra according to FIG. 4 as a function of a focus position (z-direction perpendicular to the image plane)

Afterwards, for a plurality of spectral components $S(v_{xi}, v_{yi})$ in the frequency domain, a focus dependence of a real part RS(z) and an imaginary part IS(z) of this speckle spectral component $S(v_{xi}, v_{yi})$ is determined. This is illustrated for one spectral component $S(v_{xi}, v_{yi})$ highlighted by a selection point in FIG. 4. For this spectral component S, FIG. 5 schematically shows a linearly approximated profile 25 of the real part RS(z) of this speckle spectral component $S(v_{xi}, v_{yi})$ and a likewise linearly approximated profile 26 of the imaginary part IS(z) of this spectral component $S(v_{xi}, v_{yi})$, as a function of the z-coordinate, that is to say as a function of the focus position.

The following holds true for these z-dependencies of the speckle spectral component:

$$S(z) \sim H(\Theta_d z + \Theta_{opt})$$

Here it holds true that:
H: Contribution of the roughness of the object;
$\Theta_d$: Defocus aberration of the imaging optical unit;
$\Theta_{opt}$: Other imaging aberration contribution of the imaging optical unit.

The defocus aberration $\Theta_d$ of the imaging optical unit 8 can be calculated from the known illumination setting and the known transmission function of the optical unit. On the basis of the profiles 25 and 26 of the real part RS and the imaginary part IS, on the basis of the above formula it is possible to separate the imaging aberration contribution $\Theta$ from the roughness contribution H and the other imaging aberration $\Theta_{opt}$ of the imaging optical unit 8 then results after independent determination of the defocus aberration.

In particular the z-position of the intersection point between the profiles 25, 26 of the real part RS and the imaginary part IS can be used for this separation.

The imaging aberration contribution $\Theta_{opt}$ can be written in a frequency-dependent manner as an expansion in respect of Zernike aberration functions $\Theta_n$ having an expansion coefficient zn.

$$\Theta_{opt}(\vec{v}) = \frac{1}{\lambda} \sum_n z_n \Theta_n(\vec{v})$$

Here it holds true that:

$$\Theta_n(\vec{v}) = 2\pi(\sigma P \otimes Z_n P)(\vec{v}) - (\sigma Z_n P \otimes P)(\vec{v})$$

with the Zernike polynomials $Z_n(\vec{v})$.

FIG. 6 shows the separated imaging aberration contribution $\Theta(\vec{v})$ by way of example. For the chosen illumination setting, this imaging aberration contribution has great similarity to the Zernike function Z5.

Figure 7:
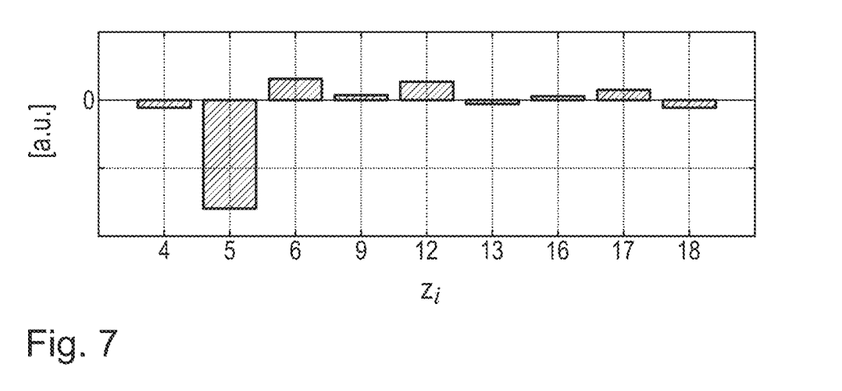
FIG. 7 shows a representation of the imaging aberration contribution according to FIG. 6 in the form of an expansion in respect of Zernike polynomials.

FIG. 7 shows the sequence of the coefficients $z_i$ of the above expansion formula for the Zernike functions Z4 to Z18. As expected the main contribution is manifested at the coefficient z for the Zernike function Z5.

Overall, therefore, the imaging aberration contribution of the imaging optical unit 8 can be measured on the basis of the measurement of an unstructured location of the mask that is regularly required anyway in metrology. Said imaging aberration contribution can then be corrected by readjusting optical components of the imaging optical unit 8. For this purpose, the control device 11 can drive the displacement actuator 13 for the corresponding displacement of the imaging component 12. Such readjustment can be carried out in pauses in operation of the metrology system 2 or else during the operation of the metrology system 2. The readjustment can be carried out by open-loop control or else, by comparison between setpoint and actual values of respective imaging aberration contributions, by closed-loop control.

This expansion of the imaging aberration contribution by Zernike functions $Z_i$ constitutes one example of an expansion of the imaging aberration contribution over a linear combination of a set of orthogonal functions.

The optical set-up of the metrology system 2 serves for the most exact possible emulation of an illumination and an imaging in the course of a projection exposure of the object 5 during the projection-lithographic production of semiconductor components.

For details regarding the focus-dependent measurement of the 2D aerial image 23, reference is made to WO 2016/012426 A1. With regard to details in connection with Fourier transformation, too, reference is made to WO 2016/012426 A1 and the references mentioned therein.

The features described above related to processing of data can be implemented by the digital image processing device 10, or be implemented in digital electronic circuitry, or in computer hardware, firmware, software, or in combinations of them. The features related to processing of data includes, e.g., determining the imaging aberration contribution of the imaging optical unit, determining the spectrum of the speckle pattern of the 3D aerial image, performing Fourier transformations, determining the focus dependence of the real part and the imaginary part of the spectral components, and separating from the determined values of the focus dependence the contribution made to the speckle pattern spectrum by the mask structure from the imaging aberration contribution made to the speckle pattern spectrum by the imaging optical unit. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor. In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the digital imaging processing device 10 is suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for determining an imaging aberration contribution of an imaging optical unit for measuring lithography masks described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A method for determining an imaging aberration contribution of an imaging optical unit for measuring lithography masks, the method comprising the following steps:
    a) focus-dependently measuring a 3D aerial image of the imaging optical unit as a sequence of 2D intensity distributions in different measurement planes in the region of and parallel to an image plane of an imaging of an object by use of the imaging optical unit;
    b) determining a spectrum $S(\vec{v})$ of a speckle pattern of the 3D aerial image by Fourier transformation of the measured 2D intensity distributions having speckle patterns;
    c) determining, for a plurality of spectral components $S(v_{xi}, v_{yi})$ in the frequency domain, a focus dependence of a real part $RS(z)$ and an imaginary part $IS(z)$ of said spectral component;
    d) separating from the determined values of the focus dependence
        aa) a contribution (H) made to the speckle pattern spectrum $(S(\vec{v}))$ by a mask structure, which contribution is to be eliminated, from
        bb) an imaging aberration contribution ($\Theta$) made to the speckle pattern spectrum by the imaging optical unit; and
    e) representing the imaging aberration contribution ($\Theta$).

2. The method according to claim 1, wherein separating involves eliminating a further contribution made by a defocus aberration ($\Theta_d$) during the measurement of the 2D intensity distributions.

3. The method according to claim 1, wherein for preparing the representation of the imaging aberration contribution ($\Theta$), the latter is approximated with the aid of a linear combination of a set of orthogonal functions (Zi).

4. The method according to claim 3, wherein coefficients ($z_n$) of a function expansion that arises in the course of the approximation are represented.

5. The method according to claim 3, wherein Zernike functions are used as a set of functions during the preparation of the representation.

6. The method according to claim 1, wherein the method is carried out on an unstructured section of a lithography mask.

7. A method for correcting an imaging aberration ($\Theta$) of an imaging optical unit of a metrology system for measuring lithography masks, the method comprising the following steps:
    a) determining an imaging aberration contribution ($\Theta$) of the imaging optical unit by a method according to claim 1; and
    b) correcting the imaging aberration contribution ($\Theta$) by readjusting optical components of the imaging optical unit taking as a basis the imaging aberration contribution ($\Theta$) determined.

8. The method of claim 7 in which determining the imaging aberration contribution ($\Theta$) of the imaging optical unit comprises eliminating a further contribution made by a defocus aberration ($\Theta_d$) during the measurement of the 2D intensity distributions.

9. The method of claim 7 in which for preparing the representation of the imaging aberration contribution ($\Theta$), the latter is approximated with the aid of a linear combination of a set of orthogonal functions (Zi).

10. The method of claim 7 in which the coefficients ($z_n$) of a function expansion that arises in the course of the approximation are represented.

11. The method of claim 7 in which the Zernike functions are used as a set of functions during the preparation of the representation.

12. The method of claim 7 in which the method for determining the imaging aberration contribution of the imaging optical unit is carried out on an unstructured section of a lithography mask.

13. A metrology system for carrying out a method according to claim 1, comprising an illumination optical unit for illuminating the lithography mask to be examined and comprising an imaging optical unit for imaging the object towards a spatially resolving detection device.

14. The metrology system according to claim 13, comprising at least one displacement actuator for displacing an imaging component of the imaging optical unit.

15. The metrology system according to claim 14, wherein the displacement actuator is signal-connected to a central open-loop/closed-loop control device of the metrology system.

16. The metrology system of claim 13 in which the metrology system is further configured to eliminate a further contribution made by a defocus aberration ($\Theta_d$) during the measurement of the 2D intensity distributions.

17. The metrology system of claim 13 in which the metrology system is further configured to approximate the imaging aberration contribution ($\Theta$) with the aid of a linear combination of a set of orthogonal functions (Zi).

18. The metrology system of claim 17 in which the metrology system is further configured to represent coefficients ($z_n$) of a function expansion that arises in the course of the approximation.

19. The metrology system of claim 17 in which Zernike functions are used as a set of functions during the preparation of the representation.

20. The metrology system of claim 13 in which the metrology system is configured to carry out the method for determining the imaging aberration contribution of the imaging optical unit on an unstructured section of a lithography mask.

* * * * *

UNITED STATES PATENT AND TRADEMARK OFFICE
CERTIFICATE OF CORRECTION

PATENT NO. : 10,481,505 B2
APPLICATION NO. : 16/280494
DATED : November 19, 2019
INVENTOR(S) : Markus Koch et al.

Page 1 of 1

It is certified that error appears in the above-identified patent and that said Letters Patent is hereby corrected as shown below:

In the Specification

Column 1
Line 62, delete "$15_{Z1}$)" and insert -- $15_{Zi}$) --

Column 2
Line 52, delete "($Z_N$)" and insert -- ($Z_n$) --

Column 6
Line 64, delete "$15_{Z1}$)" and insert -- $15_{Zi}$) --

Signed and Sealed this
Twenty-eighth Day of January, 2020

Andrei Iancu
*Director of the United States Patent and Trademark Office*